United States Patent
Gupta et al.

(10) Patent No.: US 7,521,970 B2
(45) Date of Patent: Apr. 21, 2009

(54) HIGH VOLTAGE TOLERANT INPUT BUFFER

(75) Inventors: Ranjeet Kumar Gupta, Raebareli (IN); Abhishek Katiyar, Farukhbad (IN)

(73) Assignee: STMicroelectronics Pvt. Ltd., Greater Noida, Up (IN)

( * ) Notice: Subject to any disclaimer, the term of this patent is extended or adjusted under 35 U.S.C. 154(b) by 6 days.

(21) Appl. No.: 11/683,855

(22) Filed: Mar. 8, 2007

(65) Prior Publication Data
US 2007/0210838 A1 Sep. 13, 2007

(30) Foreign Application Priority Data
Mar. 9, 2006 (IN) .......................... 628/DEL/2006

(51) Int. Cl.
*H03B 1/00* (2006.01)
*H03K 3/00* (2006.01)

(52) U.S. Cl. .................... 327/112; 327/108; 326/62; 326/80

(58) Field of Classification Search ................. 327/108, 327/112, 333, 437; 326/62, 63, 68, 80, 81; 365/189.11
See application file for complete search history.

(56) References Cited

U.S. PATENT DOCUMENTS 6,031,393 A * 2/2000 Wayner ..................... 326/81
6,720,803 B2 * 4/2004 Pihlstrom ................. 327/108

* cited by examiner

*Primary Examiner*—Quan Tra
*Assistant Examiner*—Colleen O'Toole
(74) *Attorney, Agent, or Firm*—Hogan & Hartson LLP

(57) ABSTRACT

A high voltage tolerant input buffer capable of operating across wide range of power supply, including low power supply voltages, dynamically controls the gate voltage of an NMOS pass transistor by sensing the incoming high voltage signal at the pad and dynamically controlling the gate bias voltage of NMOS pass transistor.

21 Claims, 6 Drawing Sheets

HIGH VOLTAGE TOLERANT INPUT BUFFER

CROSS REFERENCE TO RELATED APPLICATION

This application claims the priority benefit of India Patent Application No. 628/Del/2006, filed Mar. 9, 2006, entitled "HIGH VOLTAGE TOLERANT INPUT BUFFER CAPABLE OF OPERATING ACROSS WIDE RANGE OF POWER SUPPLY" which is hereby incorporated by reference herein to the maximum extent allowable by law.

FIELD OF THE INVENTION

The present invention relates to the field of input buffers used in integrated circuits, and more particularly to a high voltage tolerant input buffer capable of operating at wide range of power supply.

BACKGROUND OF THE INVENTION

Conventionally, IC packages utilized 0 and 5 volts voltage levels to represent "0" and "1" logic states respectively. However, with advancement in technology, these voltage levels have undergone a change. For example in many current IC devices manufactured by submicron semiconductor fabrication processes, a voltage level of 3.3 volts is used instead of 5 volts to represent logic state "1". This reduction in the voltage level has lead to reduced power dissipation and hence improved performance of the IC devices. With the introduction of lower voltage levels, present day IC devices work in mixed mode operation. In such a mode, circuits operating at 3.3 volts and 5 volts are coupled together. This coupling of different circuits, however, may lead to interfacing problems. If the voltage applied to the low voltage circuitry gets too high, some devices may experience temporary or even permanent damage. The Metal Oxide Semiconductor (MOS) transistors can be subjected to dielectric damage and reliability problems due to the excessive voltage developed across the gate oxide.

In addition to this, there are many applications in which the integrated circuit is required to operate across wide power supply range (e.g. 1.5 to 3.6 volts) and also require high noise immunity due to extreme environmental conditions. Generally, 3.3 volt devices are used in such circuits, which need to operate across the full power supply range. To guarantee the full functionality of the circuit across this large supply and temperature range, without exposing the gate oxide of transistors to a voltage stress together with maintaining a high noise margin is unachievable by using the conventional circuits.

High voltage tolerant input buffers are used in present day integrated circuits in order to overcome the above-mentioned interfacing problems. A conventional high voltage tolerant input buffer has been shown in the form of block diagram in FIG. 1. The buffer receives the input signal from external circuits at the input node PAD, and transmits the signal to core through node ZI. The basic structure of the high volt tolerant input buffer comprises of an NMOS pass transistor (101), an inverting input stage (102), a CMOS inverter (103) and a PMOS transistor (104). The function of NMOS pass transistor (101) is to protect the inverting input stage (102) from the voltage at the node PAD which can be higher than the power supply of the inverting input stage, VDD. The inverting input stage (102) may be a Schmitt Trigger circuit which adds hysteresis or a typical CMOS inverter stage. The CMOS inverter (103) transmits the signal to core with sufficient drive capability, after receiving it from inverting input stage (102). The PMOS transistor (104) is also known as "keeper" device. Whenever a high voltage signal arrives at input node PAD, the NMOS pass transistor (101) limits the voltage at node A to approximately a threshold voltage below the supply voltage VDD (i.e., VDD−Vthn) where Vthn denotes the threshold voltage of an NMOS transistor (101). The voltage (VDD−Vthn) at node A switches the state of inverting input stage (102) Schmitt Trigger, bringing the voltage at node B from VDD to 0 volts. The PMOS keeper transistor (104) has its gate terminal connected to node B, Source terminal to supply VDD and the Drain terminal to node A. When voltage at node B drops from VDD to 0, the PMOS keeper transistor (104) turns ON and pulls the voltage of node A from VDD−Vthn to VDD. The PMOS keeper transistor thus, turns off completely the PMOS of the inverting input stage (102). This prevents flow of leakage current through inverting input stage (102) from VDD to ground.

Figure 1:
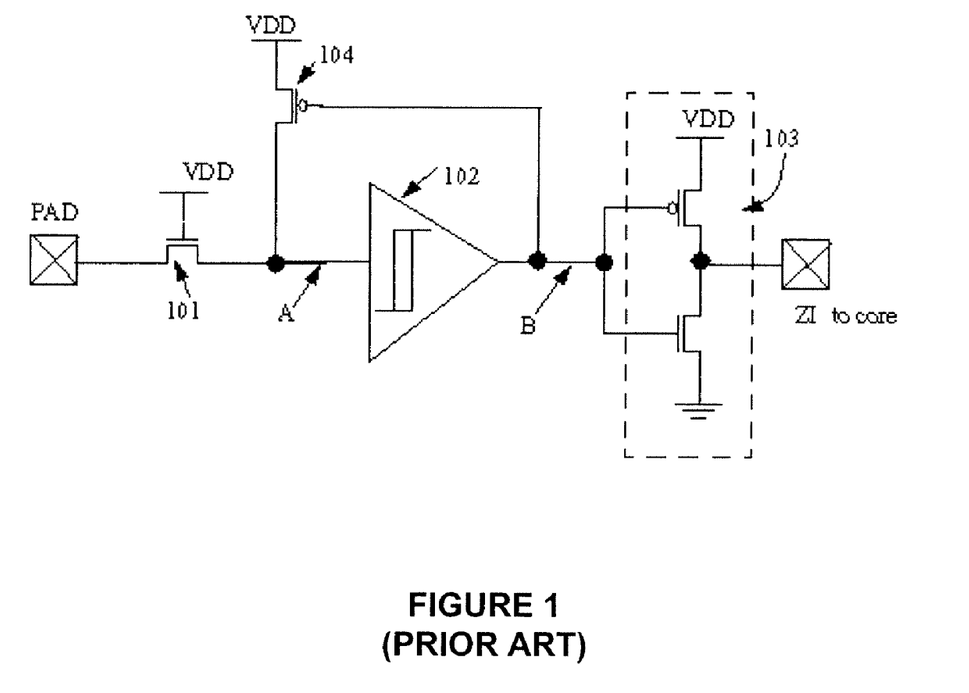
FIG. 1 shows a block diagram of a conventional high voltage tolerant input buffer.

The conventional circuit as explained above, however, fails to function when the circuit works at large supply range (for example 1.5 volts to 3.6 volts). In such circuits, 3.3 volt transistors are made to operate at very low supply voltages (example 1.5 volts). The conventional circuits do not guarantee full functionality across this large supply and temperature range, without exposing the gate oxide of transistors to a voltage stress together with maintaining a high noise margin. In the circuit explained, the inverting input stage Schmitt Trigger (102) switches its state only when the voltage at node A crosses the high level threshold (VIH) of the inverting input stage Schmitt Trigger (102). At low temperatures, the threshold voltage Vthn of the NMOS pass gate (101) is very high. This causes the voltage at node A (VDD−Vthn) to be limited to a very low value. If the voltage at node A is not high enough to cross the threshold (VIH) of inverting input stage (102), then the voltage at node B remains approximately VDD regardless of the voltage at node PAD. As a result, the PMOS keeper (104) does not turn on. This makes the circuit non-functional and also results in a very high leakage current flowing through the input stage from VDD to ground. This problem can be avoided by using a low-threshold transistor as NMOS pass transistor (101). However, that requires some extra masks during fabrication process, which in turn increases the cost of manufacturing.

Therefore, there arises a need for an input buffer, which tolerates high voltage and at the same time can operate across wide range of power supply.

There is yet another need for a high voltage tolerant input buffer which maintains fast speed of operation even at low power supply voltages without any increase in cost or process complexity.

SUMMARY OF THE INVENTION

It is an object of the present invention to provide an input buffer, which tolerates high voltage and at the same time can operate across wide range of power supply.

It is further an object of the present invention to provide a high voltage tolerant input buffer, which is cost effective and maintains fast speed of operation even at low power supply voltages without increasing the process complexity.

In order to overcome the drawbacks of the prior art and achieve the aforementioned objects, the present invention provides a high voltage tolerant input buffer capable of operating across wide range of power supply. This is done through dynamic gate voltage control of the NMOS pass transistor.

The disclosed circuit senses the incoming high voltage signal at the pad and dynamically controls the gate bias voltage of the NMOS pass transistor.

To achieve the aforementioned objects the present invention provides an input buffer capable of operating across wide range of power supply comprising an NMOS pass transistor having a drain terminal coupled to an input pin, an inverting input stage having its input terminal coupled to the source terminal of the NMOS pass transistor, a driving inverter having its input terminal coupled to output terminal of the inverting input stage and output terminal coupled to core, a keeper device so as to ensure high DC state in case of any leakage, and a dynamic gate bias control circuit coupled to gate terminal of the NMOS pass transistor for sensing the signal at input and output of the inverting input stage and dynamically controlling the gate bias voltage of the NMOS pass transistor.

The dynamic gate bias control circuit disclosed by the present invention comprises a transient detection stage for receiving inputs from input and output terminals of said inverting input stage, a weak pull up transistor connected between VDD and output terminal of the transient detection stage, a CMOS inverter stage having its input coupled to output of the transient detection stage, a buffer stage having its input coupled to output of the CMOS inverter stage, a capacitive block connected between output of the CMOS inverter stage and ground, and a PMOS having its source connected to VDD, gate to output of the buffer stage and drain to gate voltage of the NMOS pass transistor. The transient detection stage is comprised of first PMOS, second PMOS, first NMOS and second NMOS connected in series, the gates of first PMOS and second NMOS being connected to input terminal of the inverting input stage and the gates of second PMOS and first NMOS being connected to output of the inverting input stage.

BRIEF DESCRIPTION OF THE DRAWINGS

The present invention is described with the help of accompanying drawings.

DETAILED DESCRIPTION OF PREFERRED EMBODIMENTS

Figure 2:
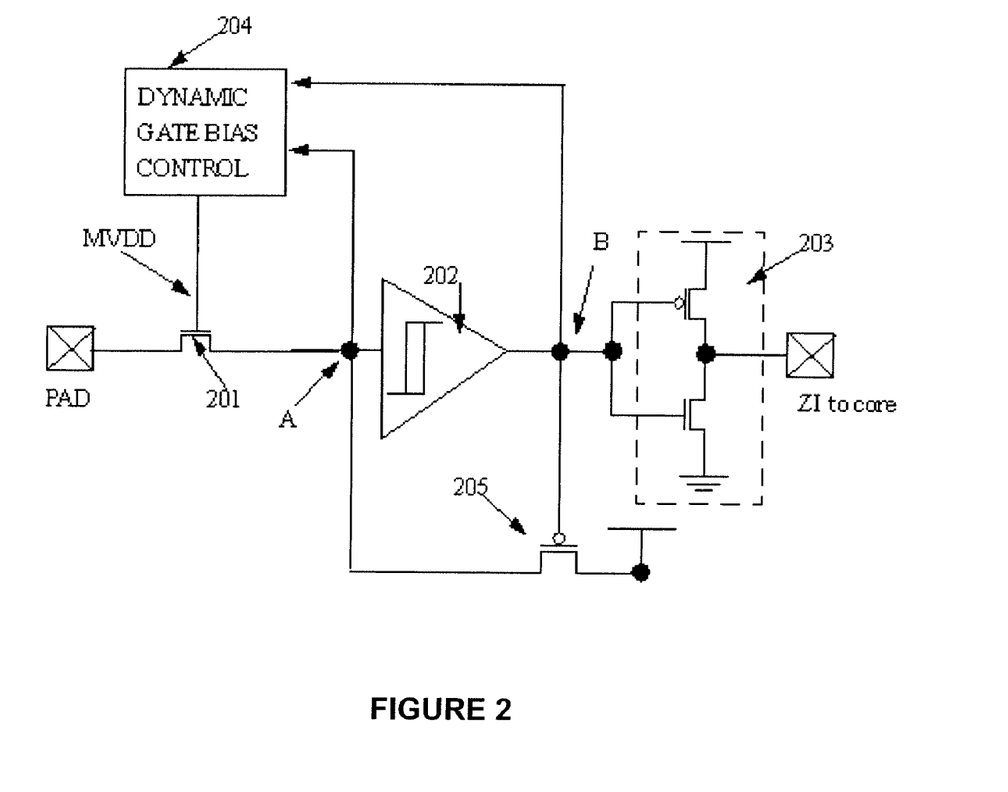
FIG. 2 is a block diagram of input buffer as disclosed by the present invention.

FIG. 2 is a block diagram of input buffer as disclosed by the present invention. The basic circuitry comprises of an NMOS pass transistor (201), an inverting input stage (202), a driving inverter (203) to core, a dynamic gate bias control circuit (204) to control the gate bias of NMOS pass transistor (201) and PMOS keeper transistor (205) to maintain voltage at node A high at DC high state. The Dynamic Gate Bias Control circuit (204) senses the signal at node A which is the input to the inverting input stage (202), and node B which is the output of the inverting input stage (202). On basis of voltage at these two nodes, the dynamic gate bias control circuit (204) dynamically controls the node MVDD which is gate bias voltage of the NMOS pass transistor (201). A weak PMOS (205) is added so as to ensure full VDD voltage at node A, when the voltage at node PAD is logic high dc state. This avoids leakage from inverting input stage (202). Whenever the input voltage at the node PAD is in steady state or falls from HIGH to LOW, the dynamic gate bias control circuit (204) maintains the voltage of node MVDD at supply voltage VDD. When the input voltage at node PAD increases from LOW to HIGH, the Dynamic Gate Bias Control Circuit (204) provides a voltage which is higher than the supply voltage VDD to the node MVDD. This enables the voltage at node A to rise to full VDD instead of VDD−Vthn as in conventional input buffer circuits.

Figure 3:
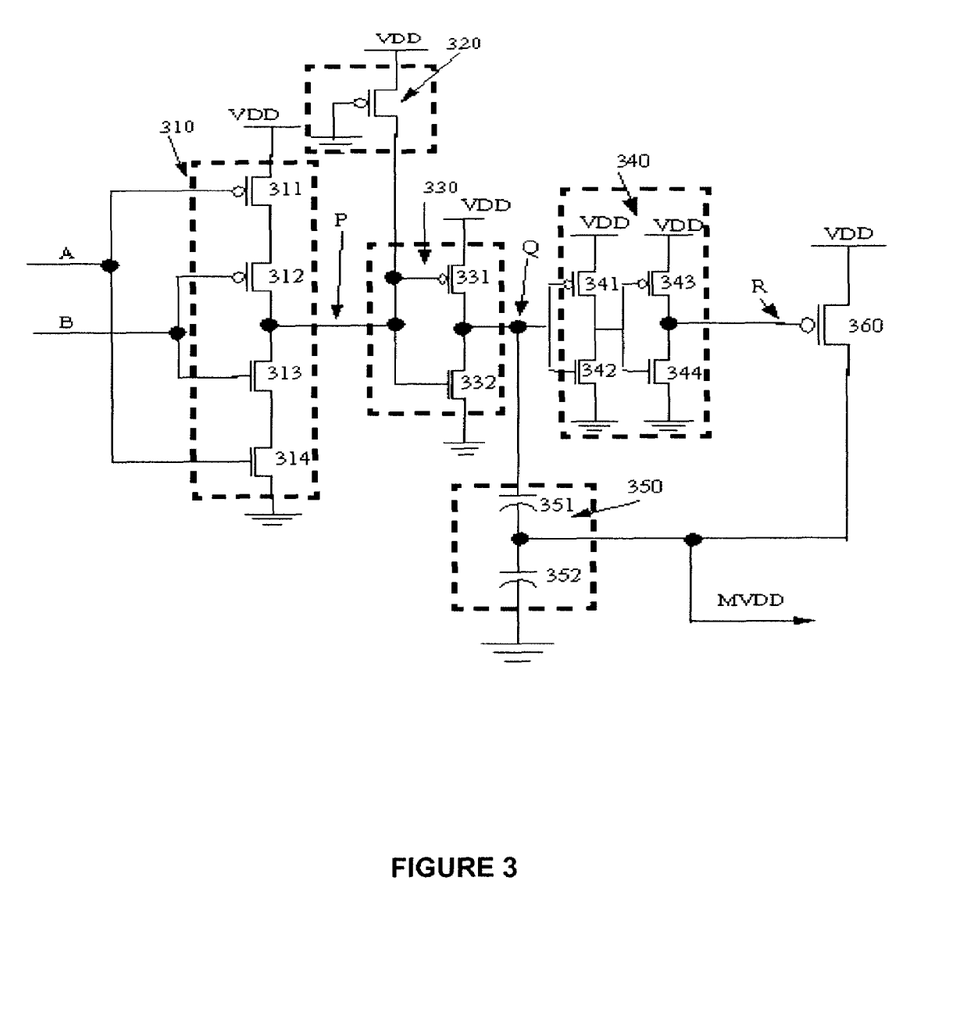
FIG. 3 shows a detailed circuit diagram of Dynamic Gate Bias Control circuit used in input buffer as disclosed by the present invention.

FIG. 3 shows a detailed circuit diagram of Dynamic Gate Bias Control circuit (204). The basic circuitry comprises of a Transient Detection Stage (310), which has two PMOSs (311 and 312) and two NMOSs (313 and 314) connected in series. The gates of PMOS (311) and NMOS (314) are connected to node A which is the input of the inverting input stage (202) described in FIG. 2. The gates of PMOS (312) and the NMOS (313) are connected to node B, which is the output of the inverting input stage (202) as described in FIG. 2. The output of the Transient Detection Stage (310) is node P. The circuit also includes a Weak Pull Up PMOS Transistor (320) connected between node P and the power supply VDD. The gate of weak pull up PMOS (320) is connected to Ground. In another embodiment, the weak pull up may be implemented by means of a resistor. The disclosed circuit further includes a CMOS inverter stage (330), a Buffer stage (340) and a capacitive block (350). The input of the CMOS inverter (330) is node P, and the output of CMOS inverter (330) is node Q, which is further input to Buffer stage (340). The CMOS inverter (330) is made of a PMOS (331) and a NMOS (332) connected in series. The Buffer stage (340) includes two stages of CMOS inverters (made of 341,342,343 and 344) connected in series. The output of the Buffer stage (340) is node R. The capacitive block (350) includes two capacitors (351) and (352) in series between node Q which is the output of CMOS inverter (330) and ground. The node connecting capacitors (351) and (352) is MVDD which is also the gate voltage of the NMOS pass transistor (201) as described in FIG. 2. In another embodiment of the present invention, the capacitors are implemented by using MOS Transistors. The circuit also includes a PMOS (360) which has its source connected to the power supply VDD, gate to node R which is the output of Buffer Stage (340), and drain to node MVDD.

When the voltage at input node PAD is 0, the voltage at node A is also 0 and the voltage at node B is VDD. In this case, PMOS (311) is ON but PMOS (312) is in OFF state. Also NMOS (314) is OFF but NMOS (313) is ON. Thus, the transient detection stage (310) is Tri-stated and the weak pull up PMOS transistor (320) pulls the voltage at node P to VDD. This makes the output of inverter (330), node Q to 0. In this case the output of Buffer (340), the node R is also 0. The 0 voltage at node R turns the PMOS Transistor (360) ON, which keeps the voltage at node MVDD equal to power supply VDD.

In the other case, when the voltage at input node PAD is High, the voltage at node A is also high and the voltage at node B is 0. Thus PMOS (311) is OFF, PMOS (312) is ON, NMOS (313) is OFF and NMOS (314) is ON. Thus the transient detection stage (310) is Tri-stated and the weak pull up PMOS transistor (320) pulls the voltage at node P to VDD. This makes the output of inverter (330), node Q to 0. In this case, the output of Buffer (340), the node R is also 0. The 0 voltage at node R turns the PMOS Transistor (360) ON, which keeps the voltage at node MVDD equal to power supply VDD.

Therefore, as explained above, irrespective of the value at the node PAD, the gate bias voltage MVDD of NMOS pass transistor (201) is always equal to VDD in DC State.

During the transient state, when the voltage at the input node PAD starts rising from 0 to High Volt, the voltage at node A also start rising from 0 towards High Volt. The voltage at node B at this point of time is VDD. When the voltage at node A rises above the threshold voltage of NMOS (314), it turns ON. Since the voltage at node B is still VDD, the NMOS (313) is also ON. The strength of the weak Pull up PMOS (320) is very weak as compared to NMOS (313) and NMOS (314), so the voltage at node P starts dropping immediately towards 0. As soon as the voltage at node P starts dropping towards 0, the voltage at node Q starts rising towards VDD. At this point of time the voltage of node R also rises from 0 to VDD turning the PMOS (360) OFF quickly. Due to the capacitive coupling of capacitor (351), the rising voltage at node Q also makes the voltage at node MVDD to rise above VDD. By suitably choosing the value of capacitor (351), we can boost the gate voltage enough (preferably VDD +Vthn) to pass full VDD to node A. This allows the voltage at node A to rise to full VDD instead of VDD−Vthn. Full VDD voltage at node A causes the voltage at node B to drop to 0, turning NMOS (313) OFF. This again tri-states the transition detection stage (310) and so the node P is again pulled up to VDD. Due to this the node voltage Q again drops to 0, bringing the node R to 0 and turning the PMOS (360) ON. At this point the voltage at node MVDD is again pulled down to VDD. Because the transition at node Q occurs slowly due to the presence of capacitor (351), the use of Buffer stage (340) is to sharpen the transition at node R, and to turn ON/OFF the PMOS Transistor (360) quickly.

Thus, during a 0 to High transition at the input node PAD, the disclosed circuit controls the gate bias voltage of NMOS pass transistor (201) and enables the voltage at node A to rise up to full VDD. This keeps the circuit operational even at low supply voltages. The value at which node MVDD rises can be controlled by suitably choosing the value of capacitor (351) and capacitor (352), which eventually controls the voltage at which node A rises. Therefore, in the disclosed circuitry, we can control the voltage at node A, and can make it to rise up to a voltage level at which the voltage at node B drops completely to 0 thus turning the PMOS of input stage (202) OFF, so as to avoid any leakage.

However, during a transition from High to 0, when the voltage at input node PAD starts dropping towards 0, the voltage at node A also starts dropping towards 0, turning the PMOS (311) ON. The voltage at node B at this time is 0, making the PMOS (312) ON. However, since the output voltage at node P is already at VDD due to presence of weak pull up, this does not make a difference in the voltage of MVDD. As soon as the voltage at A drops sufficiently to 0, the voltage at node B rises and turns the PMOS (312) OFF.

Thus, the disclosed circuit only controls the gate of NMOS pass transistor (201) when there is a transition from 0 to High Volt. During DC states and during transition from High to 0, the voltage at gate of NMOS pass transistor (201) always remains at VDD.

Figure 4:
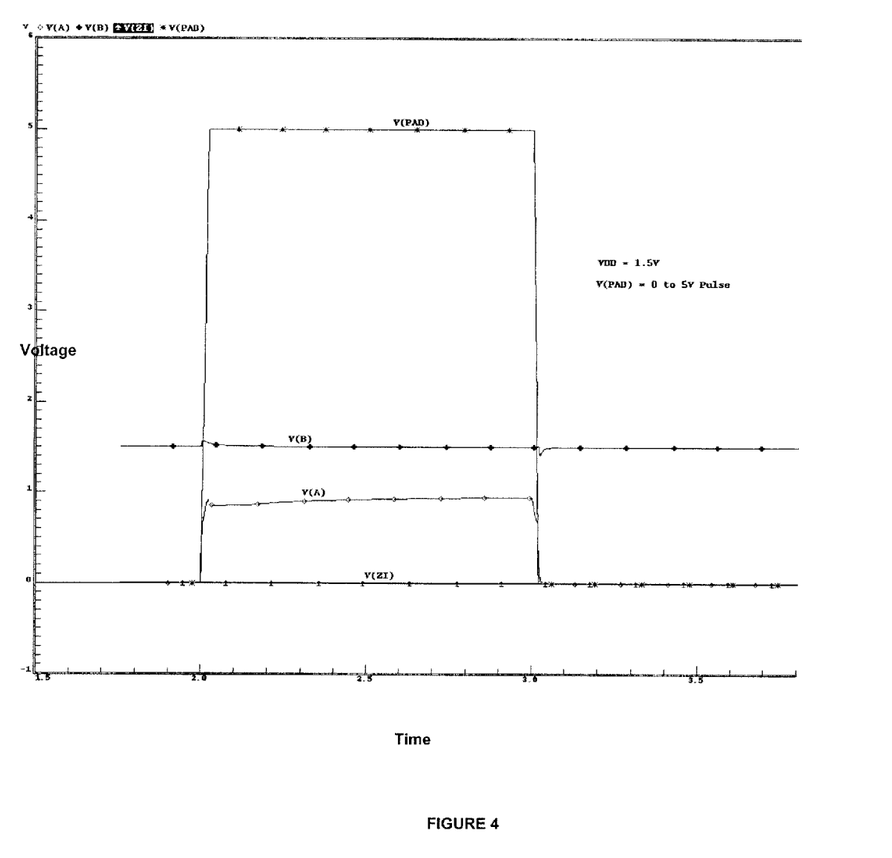
FIG. 4 shows simulation results of conventional high voltage tolerant input buffer at very low power supply.

FIG. 4 shows simulation results waveform of a conventional high voltage tolerant input buffer. The circuit operates at VDD equal to 1.5 volt. A 0 to 5v pulse is applied at PAD node. As soon as the voltage at PAD jumps from 0 to 5V, the voltage at node A (V(A)) is limited to VDD−Vthn. However, at low temperatures, the threshold voltage of NMOS pass gate (101) is very high. Therefore, the voltage at node A is limited to a very low value. This voltage is even lower than the threshold voltage (VIH) of inverting input stage (102). As a result, the voltage at node B remains VDD (which is equal to 1.5 V) irrespective of the input coming at node PAD. Thus the conventional circuit becomes non-functional at low power supply voltages.

Figure 5:
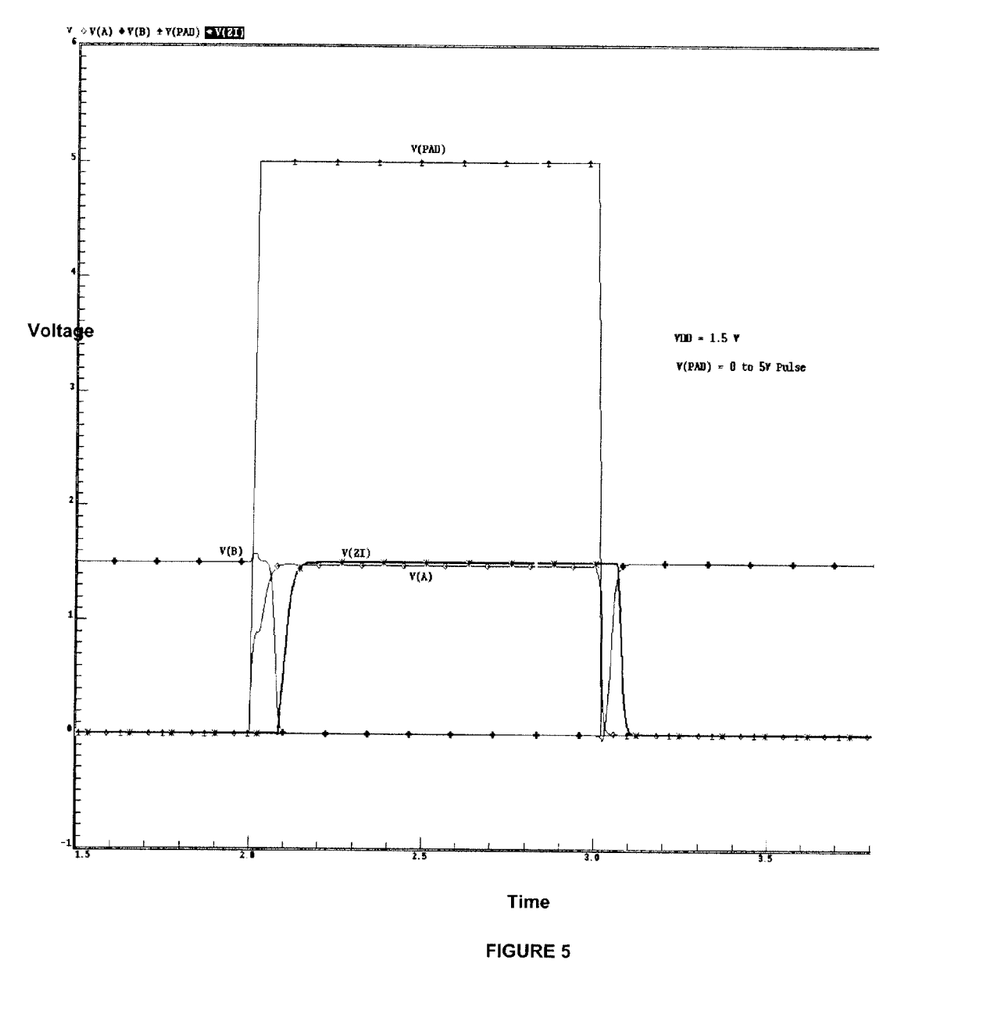
FIG. 5 shows the simulation results of high voltage tolerant input buffer disclosed by the present invention.

FIG. 5, shows the simulation results waveform for the high voltage tolerant input buffer disclosed by the present invention. The circuit operates at supply voltage VDD=1.5 V and the input at PAD node is a 0 to 5V pulse. Whenever there is a 0 to High Voltage Transition at the input node PAD (shown in the figure as V (PAD), the Dynamic gate Bias Control Circuit, boosts the voltage at node MVDD to a value higher than VDD. As a result, the voltage at node A (shown in the figure as V (A)) rises up to VDD rather than VDD−Vthn. This in turn forces the voltage at node B to 0. As a result, the voltage at node ZI is maintained at VDD, thus making the circuit remain operational even at low power supply voltages.

Figure 6:
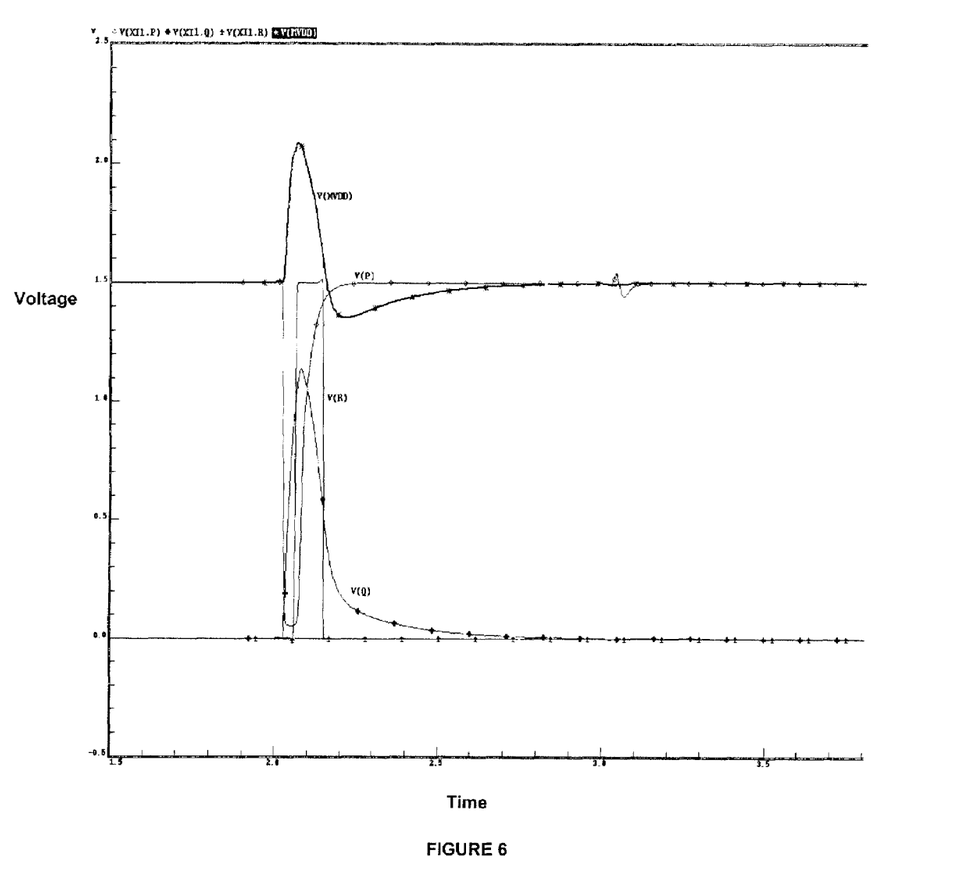
FIG. 6 shows the waveforms of internal nodes of the dynamic gate bias control circuit used in the circuitry disclosed by the present invention.

FIG. 6, shows the waveforms of internal nodes P, Q, R and MVDD of the disclosed Dynamic Gate Bias control circuit. Whenever there is a 0 to High Voltage Transition at input node PAD, the voltage at node P (shown as V(P)) drops during the transition period from VDD to almost 0V. This generates a pulse at node Q (shown as V(Q)). The rise and fall at node Q are slower due to presence of capacitor (351). The voltage at node R (V(R)) rises and falls very sharply due to the presence of Buffer (340). Due to the pulse at node Q, the voltage at node MVDD rises above VDD. In the DC States and during High to Low transition at input node PAD, the voltage at node PAD remains at VDD.

The following table slows the clear advantage of a circuit of the present invention over the conventional high voltage tolerant structure. This table compares the worst case delays with supply voltage for both the schemes.

| SUPPLY (volts) | DELAY WITH A CIRCUIT OF THE PRESENT INVENTION (nanoseconds) | DELAY WITH CONVENTIONAL CIRCUIT (nanoseconds) |
| --- | --- | --- |
| 1.5 V | 14.5 | Non-functional |
| 1.8 V | 9.0 | Non-functional |
| 2.0 V | 7.3 | 38.0 |
| 2.4 V | 5.4 | 18.0 |
| 2.7 V | 4.6 | 12.0 |
| 3.0 V | 4.0 | 9.0 |
| 3.6 V | 3.4 | 6.0 |

While there have been described above the principles of the present invention in conjunction with specific logic designs and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicant hereby reserves the right to formulate new claims to such features and/or combinations of such features during the prosecution of the present application or of any further application derived therefrom.

The invention claimed is:

1. A high voltage tolerant input buffer capable of operating across wide range of power supply comprising:
   an NMOS pass transistor having a source terminal coupled to an input pin;
   an inverting input stage having its input terminal coupled to a drain terminal of said NMOS pass transistor;
   a driving inverter having its input terminal coupled to an output terminal of said inverting input stage and an output terminal coupled to a core;
   a keeper PMOS with a gate connected to an output of said inverting input stage and a drain connected to a drain of said NMOS pass transistor and a source connected to VDD; and
   a dynamic gate bias control circuit coupled to gate terminal of said NMOS pass transistor,
   wherein said dynamic gate bias control circuit senses the signal at input and output of said inverting input stage and dynamically controls gate bias voltage of said NMOS pass transistor such that the dynamic gate bias control circuit provides a voltage that is higher than VDD to the gate terminal of said NMOS pass transistor.

2. The input buffer as claimed in claim 1, wherein said inverting input stage is a Schmitt trigger.

3. The input buffer as claimed in claim 1, wherein said inverting input stage is a typical CMOS inverter.

4. The input buffer as claimed in claim 1, wherein said driving inverter is a typical CMOS inverter.

5. A high voltage tolerant input buffer capable of operating across wide range of power supply comprising:
   an NMOS pass transistor having a source terminal coupled to an input pin;
   an inverting input stage having its input terminal coupled to a drain terminal of said NMOS pass transistor;
   a driving inverter having its input terminal coupled to an output terminal of said inverting input stage and an output terminal coupled to a core;
   a keeper PMOS with a pate connected to an output of said inverting input stage and a drain connected to a drain of said NMOS pass transistor and a source connected to VDD; and
   a dynamic gate bias control circuit coupled to gate terminal of said NMOS pass transistor and comprising,
      a transient detection stage for receiving inputs from the input and the output terminals of said inverting input stage;
      a weak pull up transistor connected between VDD and the output terminal of said transient detection stage;
      a CMOS inverter stage having its input coupled to the output of said transient detection stage;
      a buffer stage having an input coupled to the output of said CMOS inverter stage;
      a capacitive block connected between an output of said CMOS inverter stage and ground; and
      a PMOS having a source connected to VDD, a gate to an output of said buffer stage and its drain to the gate bias voltage of said NMOS pass transistor,
      wherein said dynamic gate bias control circuit senses the signal at input and output of said inverting input stage and dynamically controls gate bias voltage of said NMOS pass transistor, and wherein said transient detection stage comprises a first PMOS a second PMOS a first NMOS and a second NMOS connected in series, the gates of the first PMOS and the second NMOS being connected to the input terminal of said inverting input stage and the gates of the second PMOS and the first NMOS being connected to the output of said inverting input stage.

6. The input buffer as claimed in claim 5, wherein said weak pull up transistor is implemented by means of a resistor.

7. The input buffer as claimed in claim 5, wherein said weak pull up transistor is a PMOS transistor.

8. The input buffer as claimed in claim 5, wherein said buffer stage comprises two stages of CMOS inverter connected in series.

9. The input buffer as claimed in claim 5, wherein said capacitive block comprises two capacitors in series such that a node connecting said two capacitors is coupled to the gate terminal of said NMOS pass transistor.

10. The input buffer as claimed in claim 5, wherein said capacitive block comprises two capacitors implemented by means of MOS transistors.

11. A high voltage tolerant input buffer capable of operating across wide range of power supply comprising:
    a pass transistor having a first source/drain coupled to a high voltage tolerant input buffer input;
    an input stage having an input coupled to a second source/drain of said pass transistor;
    a driver having an input coupled to an output of said input stage and an output coupled to a high voltage tolerant input buffer output;
    a keeper transistor having a gate coupled to the output of said input stage, a first source/drain coupled to said second source/drain of said pass transistor, and a second source/drain coupled to a source of supply voltage; and
    a dynamic gate bias control circuit coupled to the gate of said pass transistor, and coupled to the input and the output of the input stage such that the dynamic gate bias control circuit provides a voltage that is higher than the source of supply voltage to the gate terminal of said pass transistor.

12. The input buffer as claimed in claim 11, wherein said input stage comprises a Schmitt trigger.

13. The input buffer as claimed in claim 11, wherein said input stage comprises a CMOS inverter.

14. The input buffer as claimed in claim 11, wherein said driver comprises a CMOS inverter.

15. A high voltage tolerant input buffer capable of operating across wide range of power supply comprising:
    a pass transistor having a first source/drain coupled to a high voltage tolerant input buffer input;
    an input stage having an input coupled to a second source/drain of said pass transistor;
    a driver having an input coupled to an output of said input stage and an output coupled to a high voltage tolerant input buffer output;
    a keeper transistor having a gate coupled to the output of said input stage, a first source/drain coupled to said second source/drain of said pass transistor, and a second source/drain coupled to a source of supply voltage; and
    a dynamic gate bias control circuit coupled to the gate of said pass transistor, and coupled to the input and the output of the input stage, said dynamic gate bias control circuit comprising
       a transient detection stage for receiving inputs from the input and the output of said input stage;
       a weak pull up element coupled between the source of supply voltage and an output of said transient detection stage;
       an inverter stage having an input coupled to the output of said transient detection stage;

a buffer stage having an input coupled to an output of said inverter stage;

a capacitive block connected between the output of said inverter stage and ground; and a transistor having a first source/drain coupled to the source of supply voltage, a gate coupled to an output of said buffer stage, and a second source/drain coupled to the gate bias voltage of said pass transistor and said capacitive block.

16. The input buffer as claimed in claim 15, wherein said weak pull up element comprises a resistor.

17. The input buffer as claimed in claim 15, wherein said weak pull up element comprises a PMOS transistor.

18. The input buffer as claimed in claim 15, wherein said buffer stage comprises two CMOS inverters coupled in series.

19. The input buffer as claimed in claim 15, wherein said capacitive block comprises two capacitors in series.

20. The input buffer as claimed in claim 15, wherein said capacitive block comprises two capacitor-connected MOS transistors.

21. A high voltage tolerant input buffer capable of operating across wide range of power supply comprising:

a pass transistor having a first source/drain coupled to a high voltage tolerant input buffer input;

an input stage having an input coupled to a second source/drain of said pass transistor;

a driver having an input coupled to an output of said input stage and an output coupled to a high voltage tolerant input buffer output;

a keeper transistor having a gate coupled to the output of said input stage, a first source/drain coupled to said second source/drain of said pass transistor, and a second source/drain coupled to a source of DC voltage; and a dynamic gate bias control circuit coupled to the gate of said pass transistor such that the dynamic gate bias control circuit provides a voltage that is higher than the source of DC voltage to the gate terminal of said pass transistor.

* * * * *